United States Patent
Meagher

(10) Patent No.: US 8,166,362 B2
(45) Date of Patent: Apr. 24, 2012

(54) FAULT DETECTION METHOD AND APPARATUS FOR ANALOG TO DIGITAL CONVERTER CIRCUITS

(75) Inventor: Thomas Bruce Meagher, Houston, TX (US)

(73) Assignee: Rockwell Automation Limited, Maldon, Essex (GB)

( * ) Notice: Subject to any disclaimer, the term of this patent is extended or adjusted under 35 U.S.C. 154(b) by 880 days.

(21) Appl. No.: 11/689,240

(22) Filed: Mar. 21, 2007

(65) Prior Publication Data

US 2008/0020712 A1    Jan. 24, 2008

Related U.S. Application Data

(60) Provisional application No. 60/785,537, filed on Mar. 24, 2006.

(30) Foreign Application Priority Data

May 31, 2006 (EP) ...................................... 06114801

(51) Int. Cl.
*G06F 11/00* (2006.01)
*G06F 17/50* (2006.01)

(52) U.S. Cl. ........................... 714/741; 714/736; 703/14

(58) Field of Classification Search ........................ None
See application file for complete search history.

(56) References Cited

U.S. PATENT DOCUMENTS

| | | | |
|---|---|---|---|
| 3,614,608 A * | 10/1971 | Giedd et al. .................. | 714/736 |
| 4,535,378 A * | 8/1985 | Endo ............................... | 361/18 |
| 4,539,683 A | 9/1985 | Hahn et al. | |
| 4,679,028 A | 7/1987 | Wilson | |
| 5,128,625 A | 7/1992 | Yatsuzuka et al. | |
| 5,140,325 A * | 8/1992 | Yu et al. ......................... | 341/143 |
| 5,293,082 A | 3/1994 | Bathaee | |
| 5,324,989 A | 6/1994 | Thornton et al. | |
| 5,552,881 A | 9/1996 | Jezwinski et al. | |
| 5,594,439 A | 1/1997 | Swanson | |
| 5,621,603 A | 4/1997 | Adamec et al. | |
| 5,774,321 A | 6/1998 | Kim et al. | |
| 5,867,014 A | 2/1999 | Wrathall et al. | |

(Continued)

FOREIGN PATENT DOCUMENTS

DE    19750349    5/1998

(Continued)

OTHER PUBLICATIONS

European Search Report For European Application 06114803.7, Sep. 5, 2006, European Patent Office.

(Continued)

*Primary Examiner* — Jeffrey A Gaffin
*Assistant Examiner* — Daniel McMahon
(74) *Attorney, Agent, or Firm* — Boyle Fredrickson, S.C.; William R. Walburn; John M. Miller

(57) ABSTRACT

This invention relates to fault detection in electrical circuits, in particular it relates to fault detection for a plurality of adjacent input circuits. The invention provides a method and apparatus for detecting a control or communication fault on an analogue circuit by simulating said analogue circuit using a simulated circuit comprising digital circuit components; the simulated circuit receiving a control input to provide a first output; and the analogue circuit receiving said control input to provide a second output; and setting an error condition when the first output and the second output differ.

12 Claims, 3 Drawing Sheets

U.S. PATENT DOCUMENTS

| | | | |
|---|---|---|---|
| 5,896,263 A | | 4/1999 | Terdan et al. |
| 5,909,660 A | * | 6/1999 | Foote .......................... 702/189 |
| 6,061,006 A | | 5/2000 | Hopkins et al. |
| 6,125,024 A | * | 9/2000 | LeComte et al. ............. 361/104 |
| 6,320,283 B1 | | 11/2001 | Salim et al. |
| 6,351,835 B1 | | 2/2002 | Sakaguchi |
| 6,400,163 B1 | | 6/2002 | Melcher et al. |
| 6,459,599 B1 | | 10/2002 | Agirmann et al. |
| 6,557,131 B1 | | 4/2003 | Arabi |
| 6,594,129 B1 | | 7/2003 | Baba et al. |
| 6,653,963 B1 | | 11/2003 | Barrenscheen et al. |
| 6,657,464 B1 | | 12/2003 | Balardeta et al. |
| 6,691,077 B1 | * | 2/2004 | Burns et al. .................. 703/4 |
| 6,768,350 B1 | | 7/2004 | Dickey |
| 7,643,979 B2 | * | 1/2010 | Hong et al. .................. 703/14 |
| 2003/0043521 A1 | | 3/2003 | Thiele |
| 2003/0063679 A1 | * | 4/2003 | Scrofano ...................... 375/260 |
| 2004/0125007 A1 | * | 7/2004 | Pezzini ......................... 341/155 |
| 2005/0135037 A1 | | 6/2005 | Thiery et al. |
| 2005/0154945 A1 | * | 7/2005 | Haag et al. .................... 714/724 |
| 2005/0174273 A1 | | 8/2005 | Luo et al. |
| 2005/0248477 A1 | * | 11/2005 | Jongsma et al. ............. 341/110 |
| 2006/0061303 A1 | | 3/2006 | Takeda et al. |

FOREIGN PATENT DOCUMENTS

| | | |
|---|---|---|
| EP | 0325786 | 8/1989 |
| EP | 0789458 | 8/1997 |
| EP | 1322139 | 6/2003 |
| EP | 1545163 | 6/2005 |
| JP | 55096708 | 7/1980 |
| JP | 60236073 | 1/1985 |
| JP | 08023244 | 1/1996 |
| WO | WO03107019 | 12/2003 |

OTHER PUBLICATIONS

European Search Report For European Application 06114803.7, Sep. 1, 2006, European Patent Office.

European Search Report For European Application 06114806.0, Aug. 30, 2006, European Patent Office.

European Search Report For European Application 06114800.3, Sep. 1, 2006, European Patent Office.

European Search Report For European Application 06114804.5, Aug. 18, 2006, European Patent Office.

European Search Report For European Application 06114805.2, Aug. 24, 2006, European Patent Office.

European Search Report For European Application 06114801.1, Sep. 11, 2006, European Patent Office.

Sigma-Delta-ADC in Software, Design&Elektronik, Product Brochure, 1998, pp. 1-18, XP002398239.

* cited by examiner

FAULT DETECTION METHOD AND APPARATUS FOR ANALOG TO DIGITAL CONVERTER CIRCUITS

CROSS-REFERENCE TO RELATED APPLICATIONS

This application is related to and claims priority from U.S. Provisional Application No. 60/785,537 filed Mar. 24, 2006 entitled Fault Detection and Apparatus, which is incorporated fully herein by reference.

BACKGROUND a. Field of the Invention

This invention relates to fault detection in electrical circuits, in particular it relates to fault detection for a plurality of adjacent input circuits.

In safety control systems, fault tolerance is of utmost importance. Fault tolerance is the ability to continue functioning in the event of one or more failures within the system.

Fault tolerance may be achieved by a number of different techniques, each with its specific advantages and disadvantages. One example of fault tolerance is known as Hardware Implemented Fault Tolerance (HIFT). HIFT means that the system relies on robust hardware circuits (as opposed to complex software algorithms) to perform the fault detection and redundancy management functions. A significant advantage HIFT has over software-implemented fault tolerance is that HIFT eliminates the overhead for communications between processors, leaving more time for controlling the process. This makes HIFT systems significantly faster and more dependable than systems using software-implemented fault tolerance.

An example of a HIFT system is a system which provides redundancy, in particular Triple Modular Redundancy (TMR). Using TMR, critical circuits are triplicated and perform identical functions simultaneously and independently. The data output from each of the three circuits is voted in a majority-voting circuit, before affecting the system's outputs. If one of the triplicated circuits fails, its data output is ignored. However, the system continues to output to the process the value (voltage, current level, or discrete output state) that agrees with the majority of the functional circuits. TMR provides continuous, predictable operation.

HIFT and TMR provides for automatic fault recovery with no disruption to system operation and ensures minimal fault detection periods.

Another approach to fault tolerance is the use of hot-standby modules. This approach provides a level of fault tolerance whereby the standby module maintains system operation in the event of module failure. With this approach there may be some disruption to system operation during the changeover period if the modules are not themselves fault-tolerant.

Fault tolerant systems ideally create a Fault Containment Region (FCR) to ensure that a fault within the FCR boundary does not propagate to the remainder of the system. This enables multiple faults to co-exist on different parts of a system without affecting operation.

Fault tolerant systems generally employ dedicated hardware and software test and diagnostic regimes that provide very fast fault recognition and response times to provide a safer system.

Commonly, it is possible to repair faults without interrupting system operation (known as hot replacement). For example active and standby module may operate in parallel so that if an active module becomes faulty there is an automatic change over to a standby module.

Safety control systems are generally designed to be 'fail-operational/fail-safe'. Fail operational means that when a failure occurs, the system continues to operate: it is in a fail-operational state. The system should continue to operate in this state until the failed module is replaced and the system is returned to a fully operational state.

An example of fail safe operation occurs, for example if, in a TMR system, a failed module is not replaced before a second failure in a parallel circuit occurs, the second failure should cause the TMR system to shut down to a fail-safe state.

Typical safety control applications include emergency and safety shutdown systems, process control, reactor control, wellhead control, turbine and compressor control, fire and gas detection and abatement, and are applicable to many industries including oil and gas production and refining, chemical production and processing, power generation, paper and textile mills and sewage treatment plants.

SUMMARY OF THE INVENTION

According to the invention there is provided a method for detecting a control or communication fault on an analogue circuit comprising the steps of: simulating said analogue circuit using a simulated circuit comprising digital circuit components; the simulated circuit receiving a control input to provide a first output; and the analogue circuit receiving said control input to provide a second output; and setting an error condition when the first output and the second output differ.

According to another aspect of the invention there is also provided an apparatus for detecting a control or communication fault on an analogue circuit comprising: a simulated circuit comprising digital components simulating said analogue circuit, said simulated circuit receiving a control input and generating a first output; an analogue circuit receiving said control input and generating a second output; and a comparator for comparing said first output and said second output; and means for generating an error condition in the event that the first output and the second output differ.

Preferably, said analogue circuit is an analogue to digital input circuit and said control input is a clock signal, and even more preferably said analogue circuit is a sigma-delta analogue to digital converter.

In a preferred embodiment the simulated circuit receives test input data from the same source as said analogue circuit.

BRIEF DESCRIPTION OF THE DRAWINGS

The invention will now be described, by way of example only, with reference to the accompanying drawings in which.

DETAILED DESCRIPTION

Figure 1:
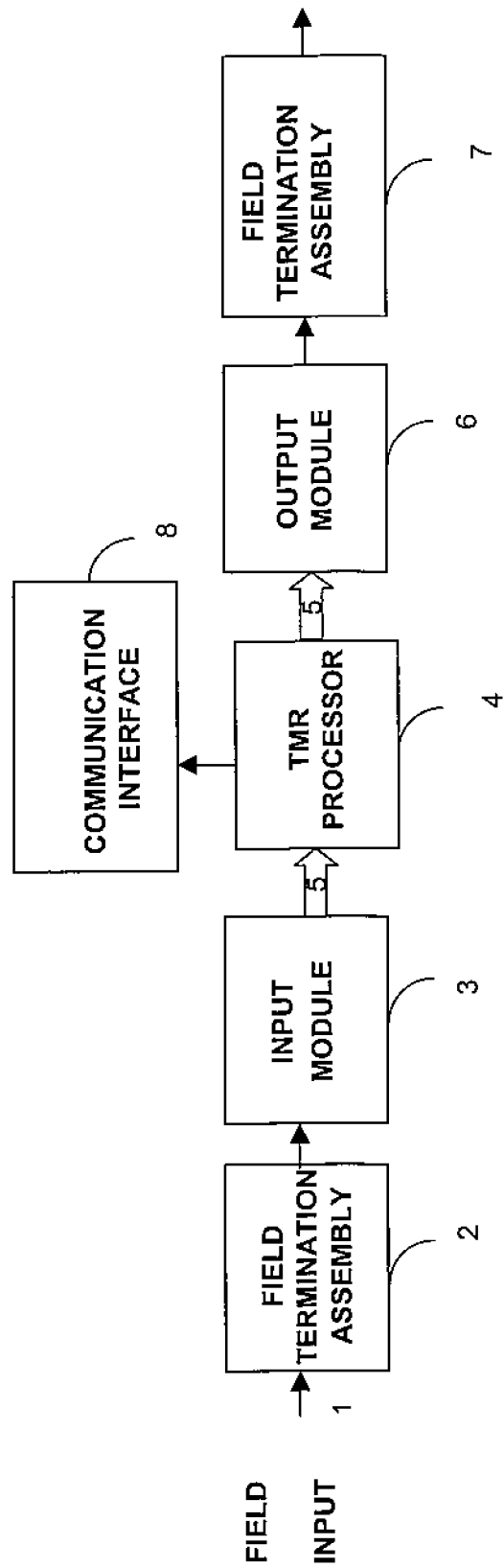
FIG. 1 illustrates schematically a fault tolerant architecture.

Referring now to FIG. 1, signals 1 from an input field device (not shown) are connected to the system via an input Field Termination Assembly (FTA) 2. An input module 3 receives, buffers and carries out any necessary conversion of the input data from the field device. The input data is then transmitted over a triplicated Inter-Module Bus (IMB) 5 to a TMR processor 4. Triplicated microprocessors of the TMR processor receive the input data from each channel of the IMB 5 and carry out a majority vote of the data. During data processing, each of the three processors compares and majority votes its input data against that of the other two processors. The processors synchronously execute the application program, and the derived output data is transmitted back to the IMB. An output module 6 receives, majority votes, and carries out any necessary conversion of the output data from the TMR processor 4. The output circuits are then driven by the majority-voted command. The output signals are connected to a field device (not shown) via an output FTA 7. A communications interface 8 provides facilities to allow systems to be networked using peer to peer communications links, the collection of Sequence of Events (SOE) data, and connection to other systems.

If an internal circuit in the system fails, it is simply voted out. Comprehensive distributed voting both out-votes failures, preventing them from being propagated into the process, and simplifies the process of identifying where faults have occurred by means identifying the source of a discrepant value.

For safety systems it is beneficial for line monitored analogue and digital input modules to detect open circuit faults between the Field Termination Assembly (FTA) and the input module itself. The requirement also exists that any fault in the components of each input circuit should be detectable.

Figure 2:
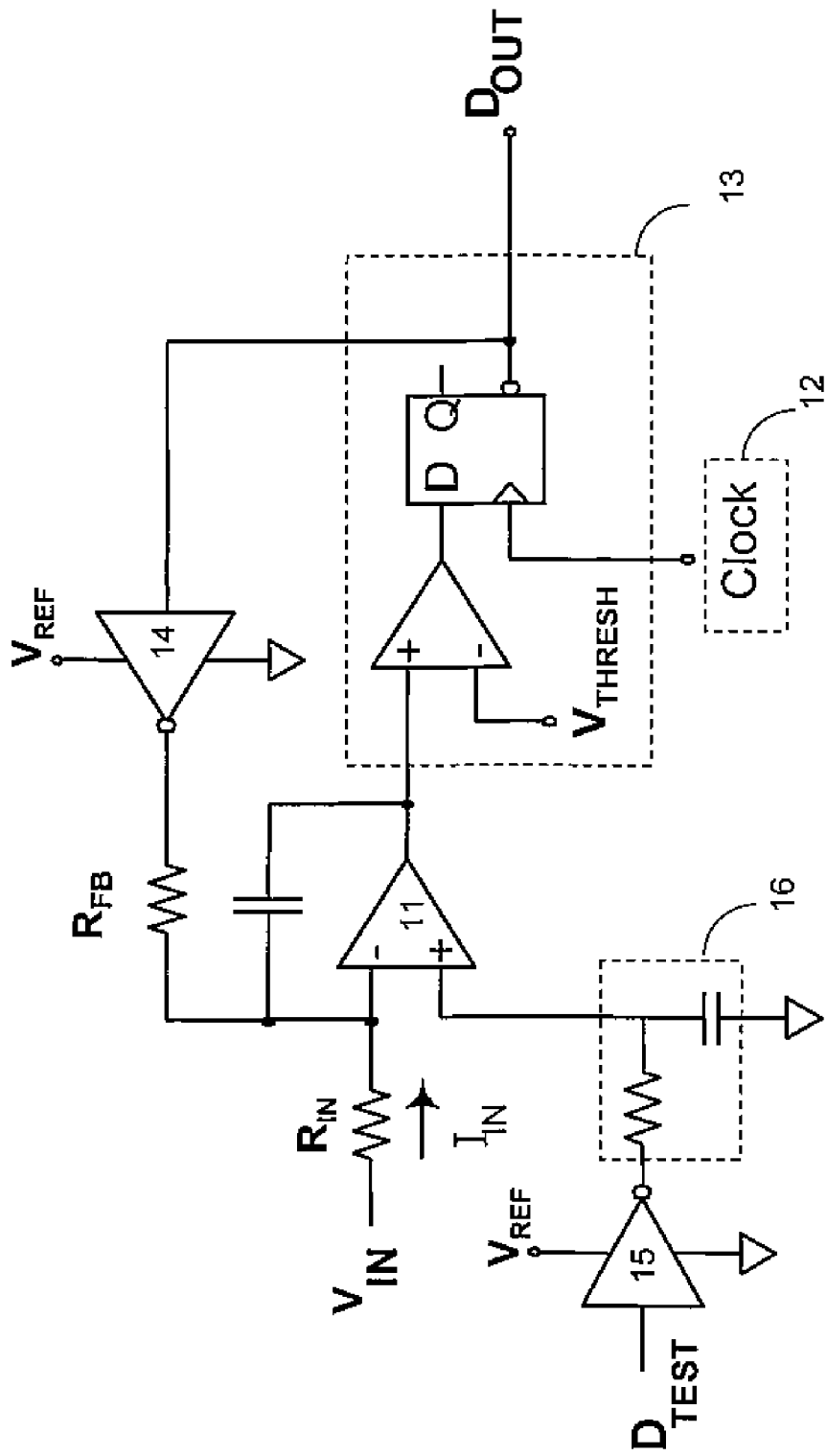
FIG. 2 illustrates a sigma-delta input circuit.

FIG. 2 illustrates a sigma-delta analogue to digital (A/D) converter 10 used by the input module 3. The input module 3 comprises an array of 42×3 triplicated sigma-delta A/D converters 10. A single array of 42 sigma-delta A/D converters is referred to herein as a 'slice'. There is a dedicated A/D converter for each of the three input 'slices'. To maximize fault detection no buffers are inserted in the signal path.

The sigma-delta A/D converter 10 comprises an integrator 11, a one-bit A/D converter 13 and a one-bit D/A converter 14. A test signal $D_{TEST}$ is converted by a one-bit D/A converter 15 and connected to a first input of the integrator 11 via an RC low pass filter 16. An input scaling resistor $R_{IN}$ connects an input $V_{IN}$ of the module to a second inverting input of the integrator 11. The output of the integrator 11 is converted to a digital output by the one-bit A/D converter 13. The one-bit D/A converter 14 feeds back an analogue version of the digital output to the inverting input via a feed back resistor $R_{FB}$.

Each sigma-delta A/D receives a global reference clock, and a unique pulse width modulated (PWM) test signal.

All of the sigma-delta A/D converters for a given input slice are controlled centrally with signals sent via a data transport system Certain classes of faults, involving the global reference clock, test signal generation, and data transport, can result in every channel being slightly in error. Such faults can be difficult to detect when testing sigma-delta A/D converters separately or comparing output signals to those of another sigma-delta A/D converter.

In order to rapidly detect such faults, a digital model of a sigma-delta A/D converter is implemented. This functional model is connected to the global reference clock and data transport subsystem, and receives it's own uniquely phased test PWM signal. Control software receives and processes the data provided by this functional model in the same way as it does the real A/D converter channels.

Because the simulated channel is implemented digitally, the simulated $D_{OUT}$ value should be precise. Small deviations of the computed values for the simulated channel from the established reference values are indicative of a systematic fault which can be quickly detected.

Figure 3:
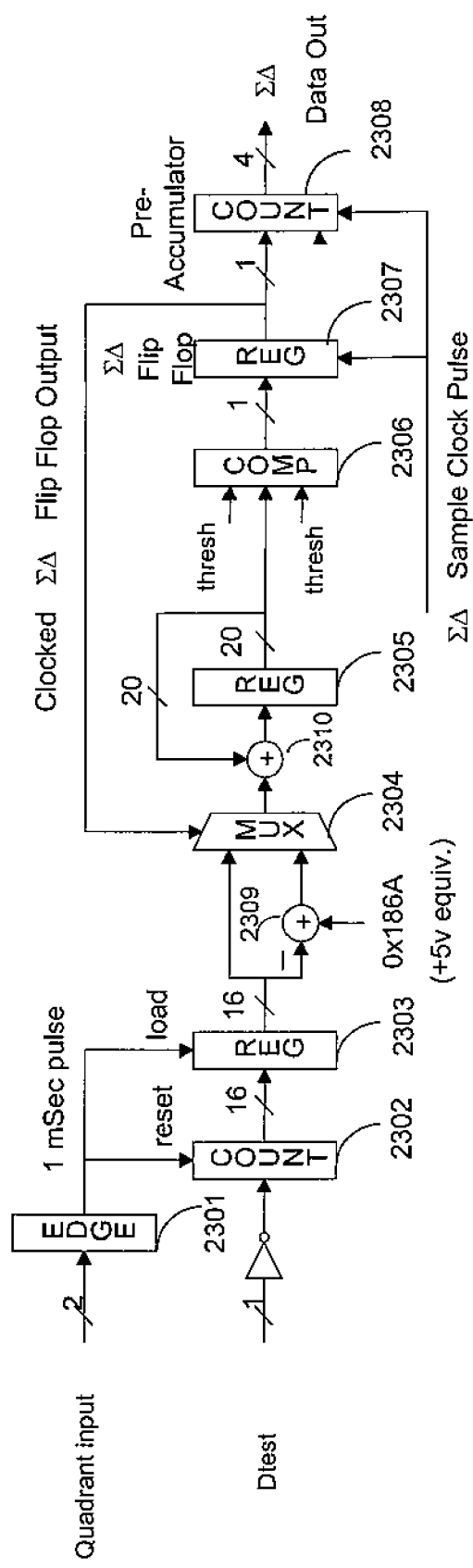
FIG. 3 illustrates a simulated digital reference sigma-delta input circuit.

Referring now to FIG. 3, a simulated digital reference channel is shown which mimics the behaviour of an analogue Sigma Delta modulator with an open input connection.

This simulated channel provides a "perfect" reference channel that responds identically to the analogue sigma-delta input modules to pulse ratio modulation signals and clock parameters, but is uninfluenced by external analogue circuitry or connections.

The data produced by this simulated channel is used to detect subtle faults in control and communications circuitry by comparing the output data with reference data and setting an error condition in the event that the compared data differ by more than a predetermined threshold.

A counter 2302 and a register 2303 are controlled by a signal from an edge detector 2301. Thus the register 2303 provides an accumulated sample value every time a quadrant input signal changes and emulates the RC filter 16 of the analogue circuit.

Two adders 2309 and 2310, a multiplexer 2304 feeding a twenty bit integrator 2305 emulate the op amp 11 of the analogue circuit.

A comparator 2306 and register 2307 simulates the A/D and D/A converters 13 and 14 of the analogue circuit.

The "Data Out" signal is bundled with the data from the other replicated analogue channels from a slice and sent to an external DSP (not shown) for processing, indistinguishably from them. The test signal amplitude and phase data are extracted and compared to stored reference values, just as for the actual analogue channels.

It is possible to use very small comparison windows (ie only tolerate very small deviations from stored reference values) for this data because the digital nature of the sigma delta simulated circuit is inherently precise under normal unfaulted operating conditions.

It is to be recognised that various alterations, modifications, and/or additions may be introduced into the constructions and arrangements of parts described above without departing from the scope of the present invention as defined in the following claims.

The invention claimed is:

1. A method for detecting a control or communication fault on an analog to digital converter circuit during use of the analog to digital converter circuit in an input circuit, the analog to digital converter circuit receiving an input to generate an analog circuit output functionally dependent on the input of the analog to digital control circuit as determined by different cooperating analog circuit elements the analog to digital control circuit further receiving a control input selected from the group consisting of at least one of a global reference clock, a test signal, and control signals sent over a data transport system, the method comprising the steps of:

digitally simulating the analog to digital converter circuit in a digitally simulated circuit by providing digital equivalents of the cooperating analog circuit elements to receive an input and the control input and generate using the digital equivalents of the analog to digital converter circuit elements, a digital circuit output functionally dependent on the input to the digitally simulated circuit and the control input;

driving the digitally simulated circuit with-an input uninfluenced by an input to the analog to digital converter circuit; and comparing an output of the digitally simulated circuit with a reference output and setting an error condition in the event that the output of the digitally simulated circuit and the reference output differ, the error indicating a fault related to the control input; and responding to the error circuit to disable the analog to digital converter circuit output.

2. An input module for receiving input data from a field device and for detecting a control or communication fault on an analog to digital converter circuit the control or communication fault related to a control input selected from at least one of a global reference clock, a test signal, and control signals sent over a data transport system, the input module comprising an analog to digital converter circuit receiving an input to generate an analog circuit output functionally dependent on the input from the field device as determined by different cooperating analog circuit elements;

a digitally simulated circuit driven with an input uninfluenced by the data from the field device; the digitally simulated circuit providing digital equivalents of the analog to digital converter circuit elements to receive an input and the control input and generate using the digital equivalents of the analog to digital converter circuit elements, output data functionally dependent on the input and the control input of the digitally simulated circuit; and a comparator for comparing output data from the digitally simulated circuit with a stored reference data; and means for generating an error condition in the event that the output of the digitally simulated circuit and the reference output differ to disable an output of the analog to digital converter circuit;

wherein the digitally simulated circuit and the analog to digital converter circuit each receive a uniquely phased test signal.

3. An apparatus according to claim 2, in which the control input is a digital signal.

4. An apparatus according to claim 3, in which the analog to digital converter circuit is a sigma-delta analog to digital converter.

5. An apparatus according to claim 2, in which the control input is a global reference clock.

6. An apparatus according to claim 2, in which the control input is a test signal.

7. An apparatus according to claim 2, in which the control input is at least one control signal sent over a data transport system.

8. The method of claim 1 in which the control input is a digital signal.

9. The method of claim 1 in which the analog to digital converter circuit is a sigma-delta analog to digital converter.

10. The method of claim 1 in which the control input is a global reference clock.

11. The method of claim 1 in which the control input is a test signal.

12. The method of claim 1 in which the control input is at least one control signal sent over a data transport system.

* * * * *